(12) United States Patent
Kreps

(10) Patent No.: US 7,279,701 B2
(45) Date of Patent: Oct. 9, 2007

(54) SEMICONDUCTOR DEVICE COMPRISING A SUPERLATTICE WITH UPPER PORTIONS EXTENDING ABOVE ADJACENT UPPER PORTIONS OF SOURCE AND DRAIN REGIONS

(75) Inventor: Scott A. Kreps, Southborough, MA (US)

(73) Assignee: RJ Mears, LLC, Waltham, MA (US)

( * ) Notice: Subject to any disclaimer, the term of this patent is extended or adjusted under 35 U.S.C. 154(b) by 290 days.

(21) Appl. No.: 10/941,062

(22) Filed: Sep. 14, 2004

(65) Prior Publication Data

US 2005/0110003 A1  May 26, 2005

Related U.S. Application Data

(63) Continuation-in-part of application No. 10/647,069, filed on Aug. 22, 2003, now Pat. No. 6,897,472, which is a continuation-in-part of application No. 10/603,696, filed on Jun. 26, 2003, now abandoned, and a continuation-in-part of application No. 10/603,621, filed on Jun. 26, 2003, now abandoned.

(51) Int. Cl.
*H01L 29/06* (2006.01)

(52) U.S. Cl. ............................ 257/28; 257/20; 257/288

(58) Field of Classification Search .................. 257/28, 257/20, 288
See application file for complete search history.

(56) References Cited

U.S. PATENT DOCUMENTS

| | | | |
|---|---|---|---|
| 4,485,128 A | 11/1984 | Dalal et al. | 427/85 |
| 4,594,603 A | 6/1986 | Holonyak, Jr. | 357/16 |
| 4,882,609 A | 11/1989 | Schubert et al. | 357/22 |

(Continued)

FOREIGN PATENT DOCUMENTS

EP  0 843 361  5/1998

(Continued)

OTHER PUBLICATIONS

Patent Abstracts of Japan, vol. 012, No. 080 (E-590), Mar. 12, 1988 & JP 62 219665 A (Fujitsu Ltd), Sep. 26, 1987 abstract.

(Continued)

*Primary Examiner*—Long Pham
(74) *Attorney, Agent, or Firm*—Allen, Dyer, Doppelt, Milbrath & Gilchrist, P.A.

(57) ABSTRACT

A semiconductor device may include a semiconductor substrate and at least one metal oxide semiconductor field-effect transistor (MOSFET). The MOSFET may include spaced apart source and drain regions on the semiconductor substrate, and a superlattice including a plurality of stacked groups of layers on the semiconductor substrate between the source and drain regions. The superlattice may have upper portions extending above adjacent upper portions of the source and drain regions, and lower portions contacting the source and drain regions so that a channel is defined in lower portions of said superlattice. Furthermore, each group of layers of the superlattice may include a plurality of stacked base semiconductor monolayers defining a base semiconductor portion and an energy band-modifying layer thereon. The energy-band modifying layer may include at least one non-semiconductor monolayer constrained within a crystal lattice of adjacent base semiconductor. A gate may overly the superlattice.

46 Claims, 14 Drawing Sheets

U.S. PATENT DOCUMENTS

| | | | |
|---|---|---|---|
| 4,908,678 A | 3/1990 | Yamazaki | 357/4 |
| 4,937,204 A | 6/1990 | Ishibashi et al. | 437/110 |
| 4,969,031 A | 11/1990 | Kobayashi et al. | 357/63 |
| 5,055,887 A | 10/1991 | Yamazaki | 357/4 |
| 5,081,513 A | 1/1992 | Jackson et al. | 357/23.7 |
| 5,216,262 A * | 6/1993 | Tsu | 257/17 |
| 5,357,119 A | 10/1994 | Wang et al. | 257/18 |
| 5,606,177 A | 2/1997 | Wallace et al. | 257/25 |
| 5,683,934 A | 11/1997 | Candelaria | 437/134 |
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B2 | 10/2002 | Takagi | 257/77 |
| 6,498,359 B2 | 12/2002 | Schmidt et al. | 257/190 |
| 6,501,092 B1 | 12/2002 | Nikonov et al. | 257/29 |
| 6,521,519 B2 | 2/2003 | Kamath et al. | 438/786 |
| 6,566,679 B2 | 5/2003 | Nikonov et al. | 257/29 |
| 6,621,097 B2 | 9/2003 | Nikonov et al. | 257/17 |
| 2003/0034529 A1 | 2/2003 | Fitzgerald et al. | 257/369 |
| 2003/0057416 A1 | 3/2003 | Currie et al. | 257/19 |
| 2003/0162335 A1 | 8/2003 | Yuki et al. | 438/151 |
| 2003/0215990 A1 | 11/2003 | Fitzgerald et al. | 438/172 |
| 2005/0196927 A1* | 9/2005 | Wang et al. | 438/287 |

FOREIGN PATENT DOCUMENTS

| | | |
|---|---|---|
| GB | 2347520 | 9/2000 |
| JP | 61145820 | 7/1986 |
| JP | 61220339 | 9/1986 |
| WO | 99/63580 | 12/1999 |
| WO | 02/103767 | 12/2002 |

OTHER PUBLICATIONS

Patent Abstracts of Japan, vol. 010, No. 179 (E-414), Jun. 24, 1986 & JP 61 027681 A (Res Dev Corp of Japan), Feb. 7, 1986 abstract.

Luo et al., *Chemical Design of Direct-Gap Light-Emitting Silicon*, published Jul. 25, 2002, The American Physical Society; vol. 89, No. 7.

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

* cited by examiner

SEMICONDUCTOR DEVICE COMPRISING A SUPERLATTICE WITH UPPER PORTIONS EXTENDING ABOVE ADJACENT UPPER PORTIONS OF SOURCE AND DRAIN REGIONS

CROSS-REFERENCE TO RELATED APPLICATIONS

This application is a continuation-in-part of U.S. patent application Ser. No. 10/647,069 filed Aug. 22, 2003 now U.S. Pat. No. 6,897,472, which in turn is a continuation-in-part of U.S. patent application Ser. No. 10/603,696 now abandoned and Ser. No. 10/603,621, both filed on Jun. 26, 2003 now abandoned, the entire disclosures of which are hereby incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2/Si$ with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Another example of an optical device incorporating a superlattice is disclosed in U.S. Pat. No. 6,566,679 to Nikonov et al. This patent discloses an integrated semiconductor optical modulator which includes a semiconductor substrate and associated integrated circuit element. The integrated circuit element includes a superlattice having alternating layers of the semiconductor material and an insulator. The semiconductor layers and insulator layers are configured to cause direct bandgap absorption of radiation energy in the semiconductor layers to modulate a radiation beam that passes through the superlattice structure.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller device features.

SUMMARY OF THE INVENTION

In view of the foregoing background, it is therefore an object of the present invention to provide a semiconductor device including one or more MOSFETS having relatively high charge carrier mobility and related methods.

This and other objects, features, and advantages in accordance with the present invention are provided by a semiconductor device which may include a semiconductor substrate and at least one metal oxide semiconductor field-effect transistor (MOSFET). More particularly, the MOSFET may include spaced apart source and drain regions on the semiconductor substrate, and a superlattice including a plurality of stacked groups of layers on the semiconductor substrate between the source and drain regions. The superlattice may have upper portions extending above adjacent upper portions of the source and drain regions, and lower portions contacting the source and drain regions so that a channel is defined in lower portions of the superlattice. Furthermore, each group of layers of the superlattice may include a plurality of stacked base semiconductor monolayers defining a base semiconductor portion and an energy band-modifying layer thereon. The energy-band modifying layer may include at least one non-semiconductor monolayer constrained within a crystal lattice of adjacent base semiconductor. The MOSFET may further include a gate overlying the superlattice.

More specifically, the source and drain regions may each have a respective trench therein adjacent the superlattice, and the upper portions of the superlattice may extend above bottom portions of the trenches. Also, the source and drain regions may each include a respective epitaxial silicon layer, and the superlattice may have a greater thickness than the epitaxial silicon layers. The gate may include an oxide layer overlying the superlattice channel and a gate electrode overlying the oxide layer. Further, a contact layer may be on the source regions and/or the drain region.

Furthermore, the superlattice channel may have a common energy band structure therein, and it may also have a higher charge carrier mobility than would otherwise be present. Each base semiconductor portion may comprise silicon or germanium, for example, and each energy band-modifying layer may comprise oxygen. Further, each energy band-modifying layer may be a single monolayer thick, and each base semiconductor portion may be less than eight monolayers thick.

The superlattice may further have a substantially direct energy bandgap, and it may also include a base semiconductor cap layer on an uppermost group of layers. In one embodiment, all of the base semiconductor portions may be a same number of monolayers thick. In accordance with an alternate embodiment, at least some of the base semiconductor portions may be a different number of monolayers thick. In addition, each energy band-modifying layer may include a non-semiconductor selected from the group consisting of oxygen, nitrogen, fluorine, and carbon-oxygen, for example.

DETAILED DESCRIPTION OF THE PREFERRED EMBODIMENTS

Figure 1:
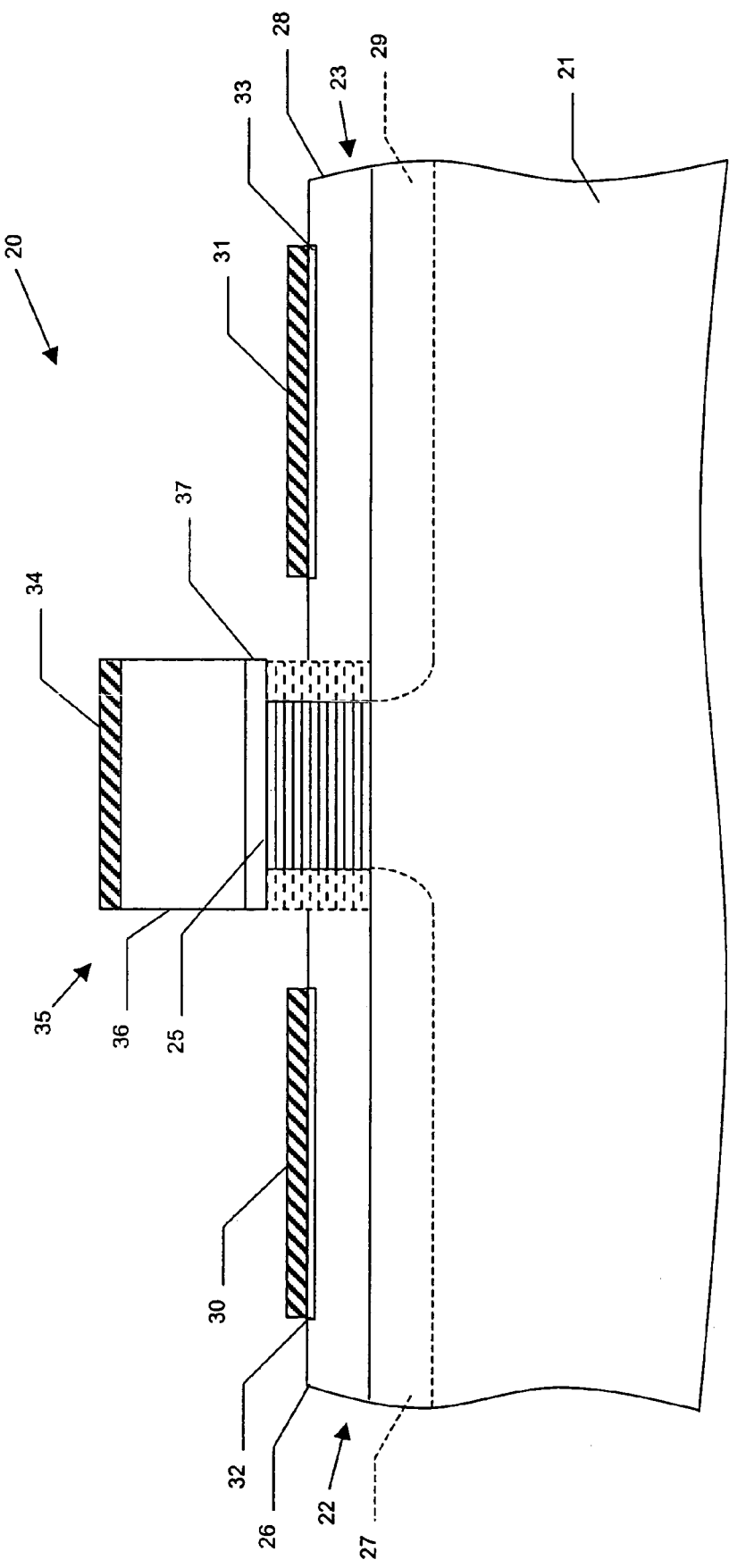
FIG. 1 is schematic cross-sectional view of a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material for a channel region in a semiconductor device. A planar MOSFET 20 including the superlattice 25 in accordance with the invention is now first described with reference to FIG. 1. One skilled in the art, however, will appreciate that the materials identified herein could be used in many different types of semiconductor devices, such as discrete devices and/or integrated circuits.

The illustrated MOSFET 20 includes a substrate 21, source and drain regions 22, 23, and the superlattice 25 is positioned between the source and drain regions. In the illustrated example, the source and drain regions 22, 23 are raised source and drain regions in that they include respective epitaxial silicon layers 26, 28 formed on the substrate 21 which are doped to the desired concentration. Moreover, the dopant may permeate portions 27, 29 of the substrate 21 so that the source and drain regions 22, 23 extend beneath the epitaxial layers 26, 28, respectively, and under the superlattice 25, as shown.

The MOSFET 20 also illustratively includes a gate 35 comprising a gate insulating (e.g., oxide) layer 37 on the superlattice 25 and a gate electrode layer 36 on the gate insulating layer. Source/drain silicide layers 30, 31 and source/drain contacts 32, 33 overlie the source/drain regions, as will be appreciated by those skilled in the art.

In the illustrated embodiment, upper portions of the superlattice 25 extend above adjacent upper portions of the source and drain regions 22, 23, and, more particularly, the epitaxial layers 26, 28. Stated alternately, the superlattice 25 has a greater thickness than the epitaxial layers 26, 28, and thus upper sidewall portions of the superlattice do not contact the epitaxial layers. Yet, lower sidewall portions of the superlattice 25 do contact the source and drain regions 22, 23 as shown so that a channel is defined in lower portions of the superlattice.

Accordingly, it will be appreciated by those skilled in the art that the channel only occupies the lower portion of the superlattice 25, and thus current flow is reduced in the upper portions of the superlattice near the gate insulating layer 37. This advantageously reduces hot carrier injection, for example, which may otherwise result in premature oxide breakdown and failure, as will be appreciated by those skilled in the art.

Applicants have identified improved materials or structures for the superlattice 25 of the MOSFET 20. More specifically, the Applicants have identified materials or structures having energy band structures for which the appropriate conductivity effective masses for electrons and/or holes are substantially less than the corresponding values for silicon.

Figure 2:
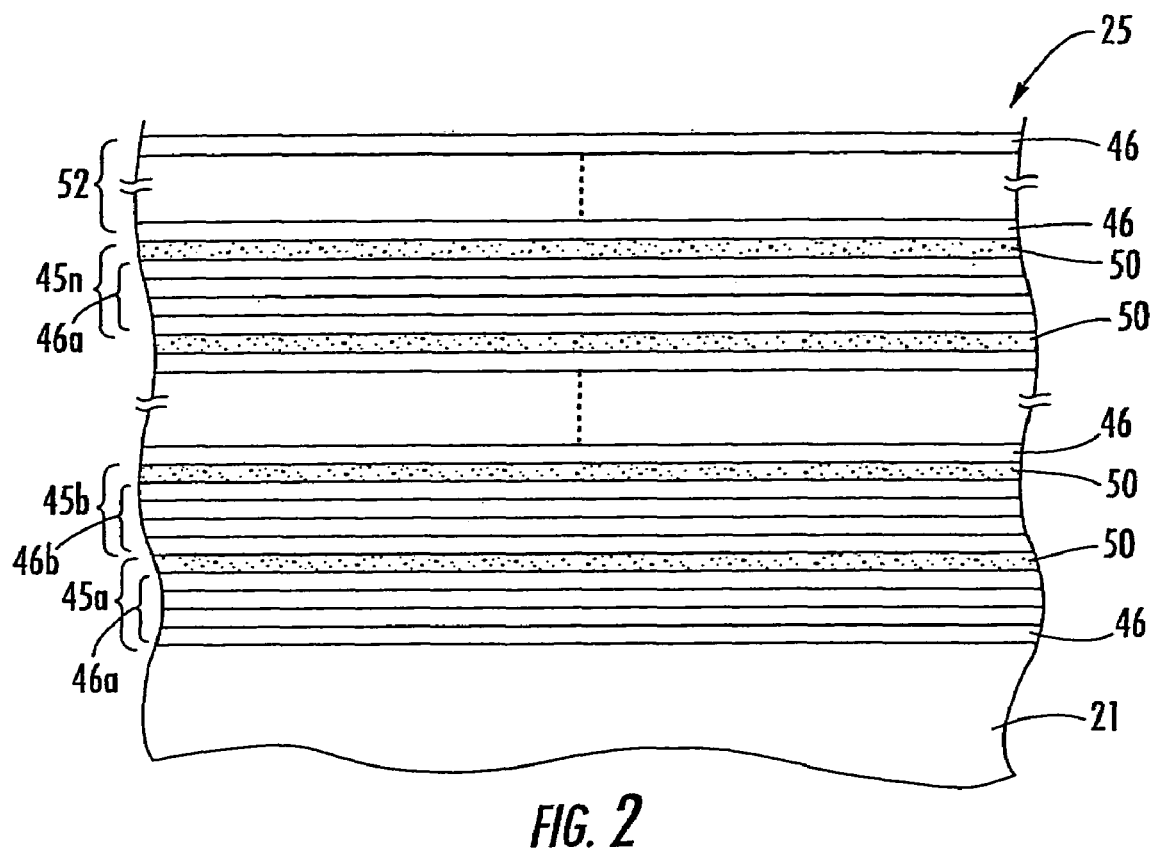
FIG. 2 is a greatly enlarged schematic cross-sectional view of the superlattice as shown in FIG. 1.
Figure 3:
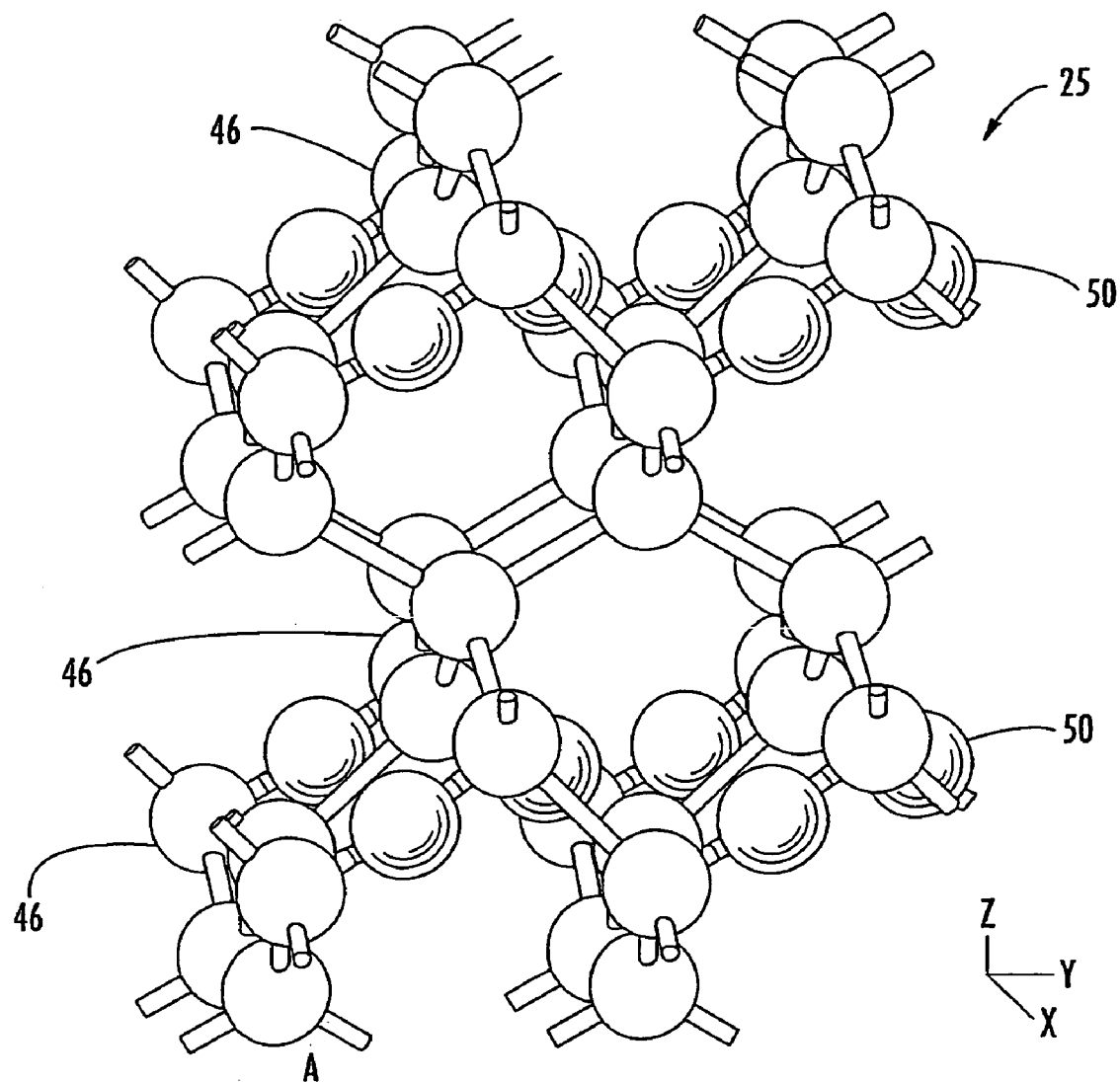
FIG. 3 is a perspective schematic atomic diagram of a portion of the superlattice shown in FIG. 1.

Referring now additionally to FIGS. 2 and 3, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 2.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 2 for clarity of illustration.

The energy-band modifying layer 50 illustratively includes one non-semiconductor monolayer constrained within a crystal lattice of adjacent base semiconductor portions. In other embodiments, more than one such monolayer may be possible. It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that the energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure.

It is also theorized that the semiconductor device, such as the illustrated MOSFET 20, enjoys a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, as described in further detail below.

As will be appreciated by those skilled in the art, the source/drain regions 22, 23 and gate 35 of the MOSFET 20 may be considered as regions for causing the transport of charge carriers through the superlattice in a parallel direction relative to the layers of the stacked groups 45a-45n. Other such regions are also contemplated by the present invention.

The superlattice 25 also illustratively includes a cap layer 52 on an upper layer group 45n The cap layer 52 may comprise a plurality of base semiconductor monolayers 46. The cap layer 52 may have between 2 to 100 monolayers of the base semiconductor, and, more preferably, between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example Each energy band-modifying layer 50 may comprise a non-semiconductor selected from the group consisting of oxygen, nitrogen, fluorine, and carbon-oxygen for example. The non-semiconductor is also desirably thermally stable through deposition of a next layer to thereby facilitate manufacturing. In other embodiments, the non-semiconductor may be another inorganic or organic element or compound that is compatible with the given semiconductor processing, as will be appreciated by those skilled in the art.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 2 and 3 for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12, resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers, as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein as will also be appreciated by those skilled in the art.

Figure 4:
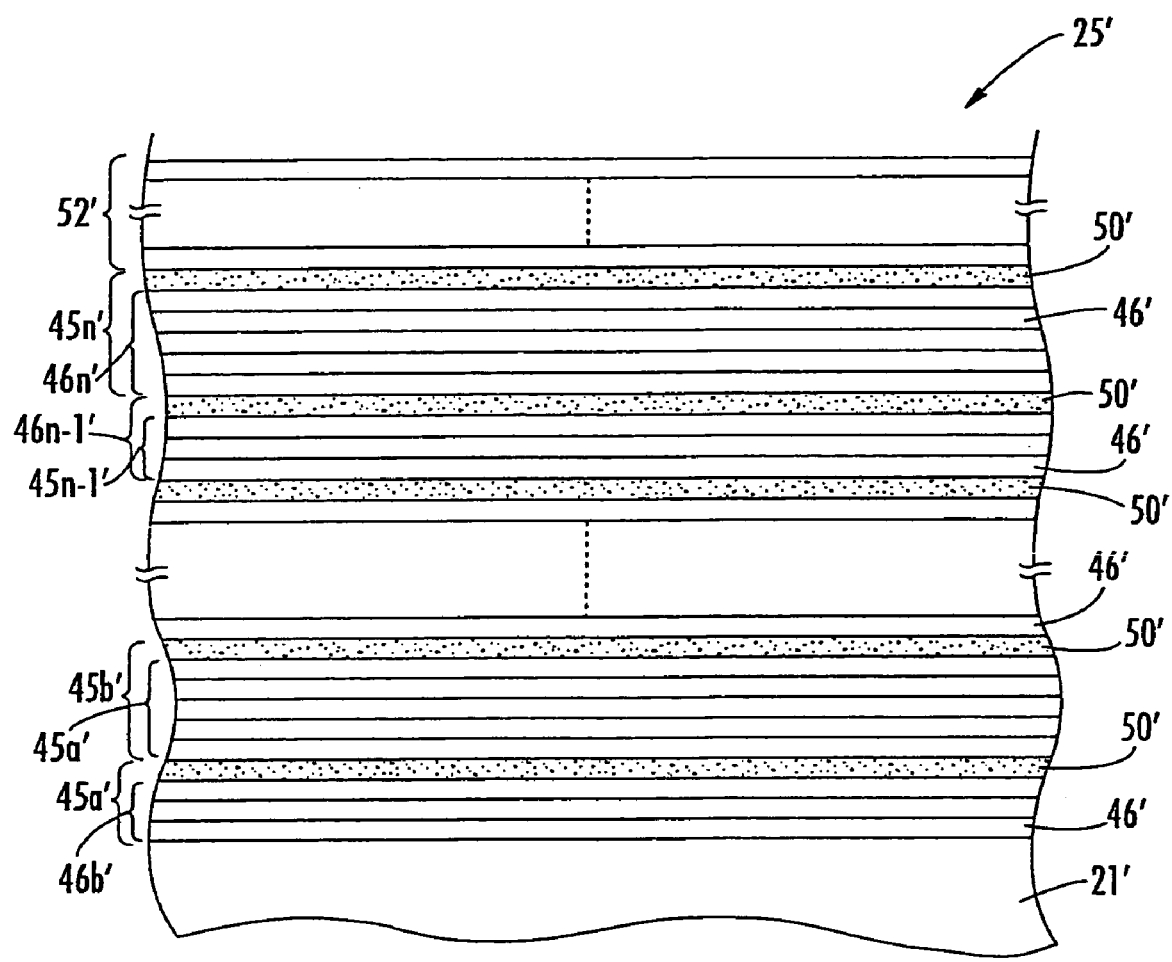
FIG. 4 is a greatly enlarged schematic cross-sectional view of another embodiment of a superlattice that may be used in the device of FIG. 1.

Indeed, referring now additionally to FIG. 4, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 4 not specifically mentioned are similar to those discussed above with reference to FIG. 2 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 5A:
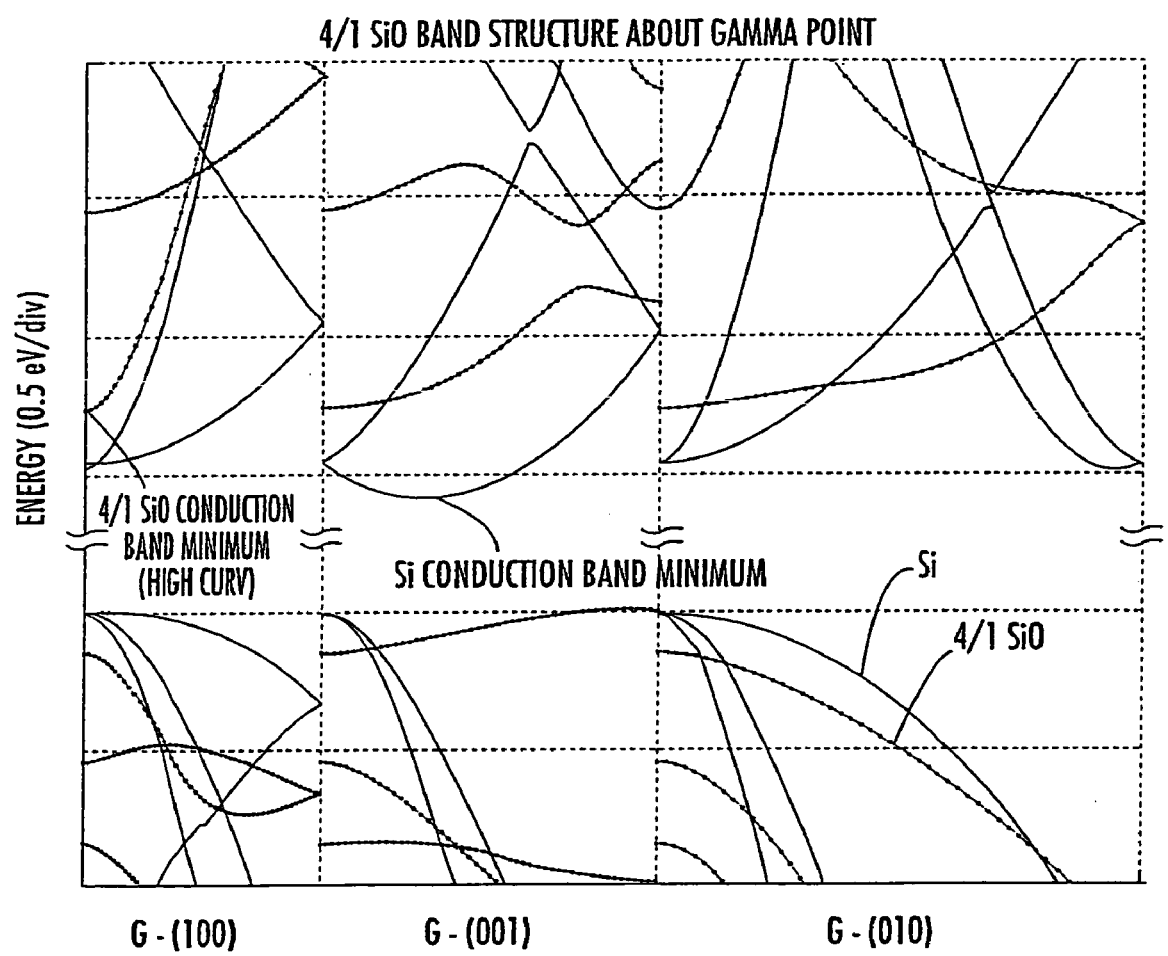
FIG. 5A is a graph of the calculated band structure from the gamma point (G) for both bulk silicon as in the prior art, and for the 4/1 Si/O superlattice as shown in FIGS. 1-3.
Figure 5B:
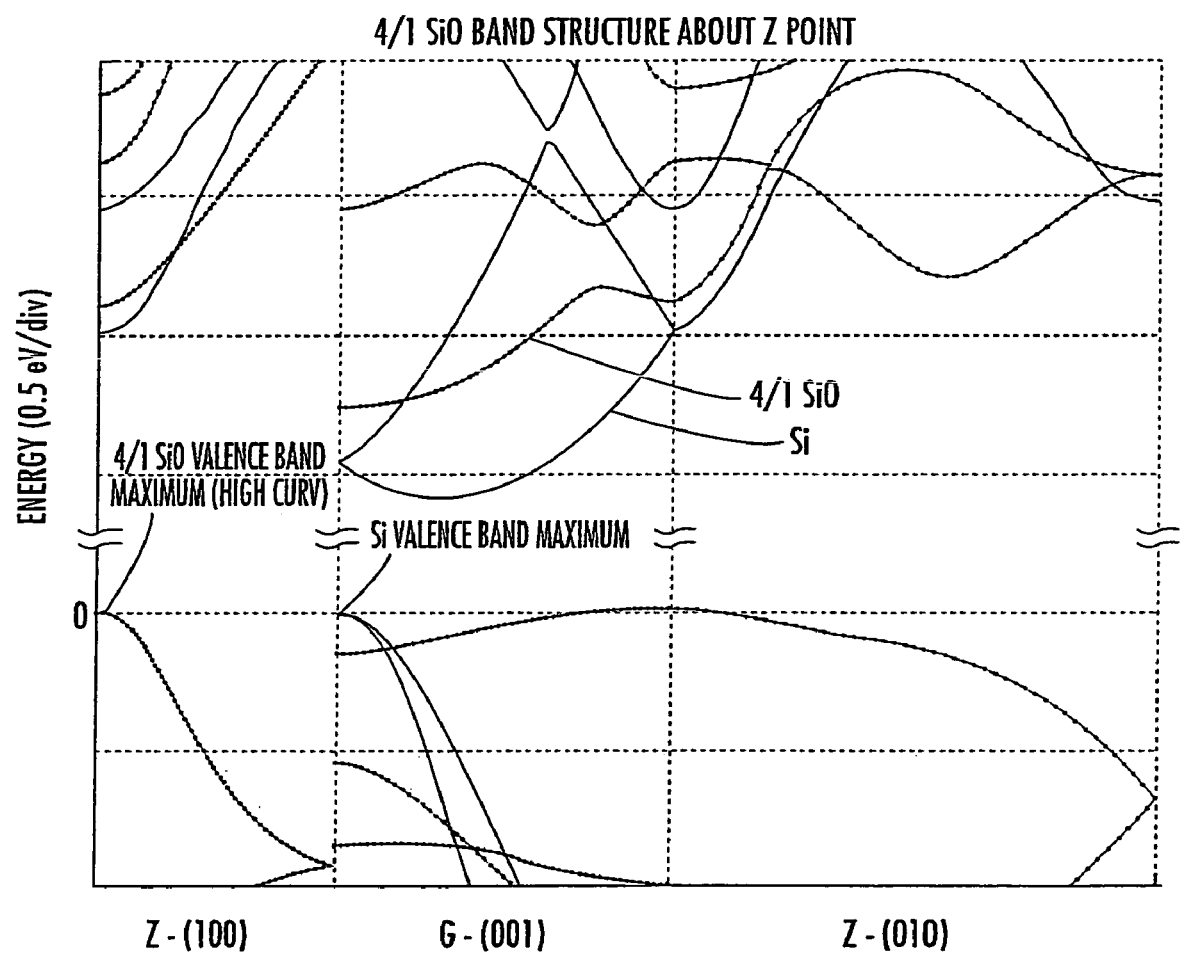
FIG. 5B is a graph of the calculated band structure from the Z point for both bulk silicon as in the prior art, and for the 4/1 Si/O superlattice as shown in FIGS. 1-3.
Figure 5C:
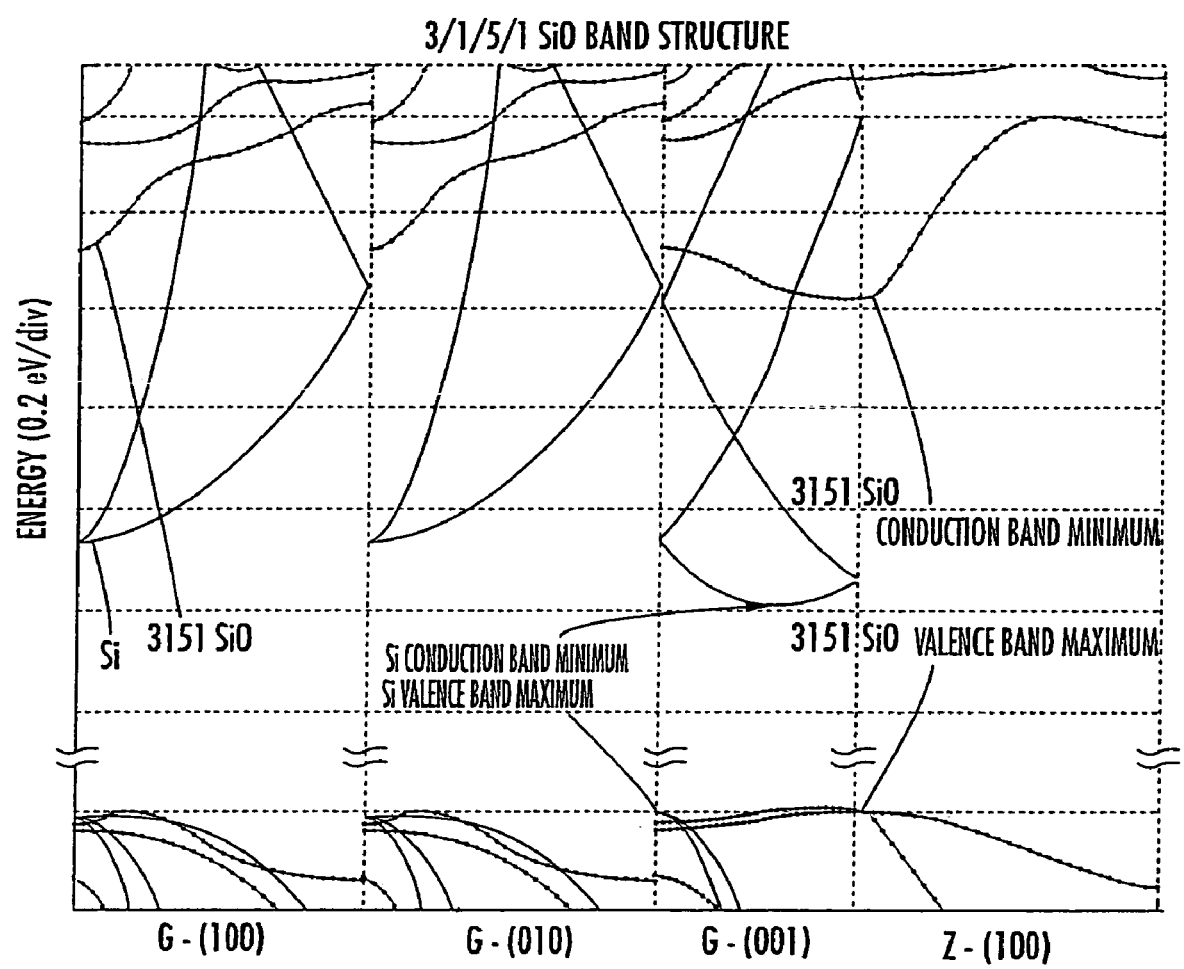
FIG. 5C is a graph of the calculated band structure from both the gamma and Z points for both bulk silicon as in the prior art, and for the 5/1/3/1 Si/O superlattice as shown in FIG. 4.

In FIGS. 5A-5C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 5A shows the calculated band structure from the gamma point (G) for both bulk silicon (represented by continuous lines) and for the 4/1 Si/O superlattice 25 as shown in FIGS. 1-3 (represented by dotted lines). The directions refer to the unit cell of the 4/1 Si/O structure and not to the conventional unit cell of Si, although the (001) direction In the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 5B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 5C shows the calculated band structure from both the gamma and Z point for both bulk silicon (continuous lines) and for the 5/1/3/1 Si/O structure of the superlattice 25' of FIG. 4 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e., perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Referring now additionally to FIGS. 6A-6E, a method for making the MOSFET 20 will now be described. The method begins with providing the silicon substrate 21. By way of example, the substrate may be an eight-inch wafer 21 of lightly doped P-type or N-type single crystal silicon with <100> orientation, although other suitable substrates may also be used. In accordance with the present example, a layer of the superlattice 25 material is then formed across the upper surface of the substrate 21.

Figure 6A:
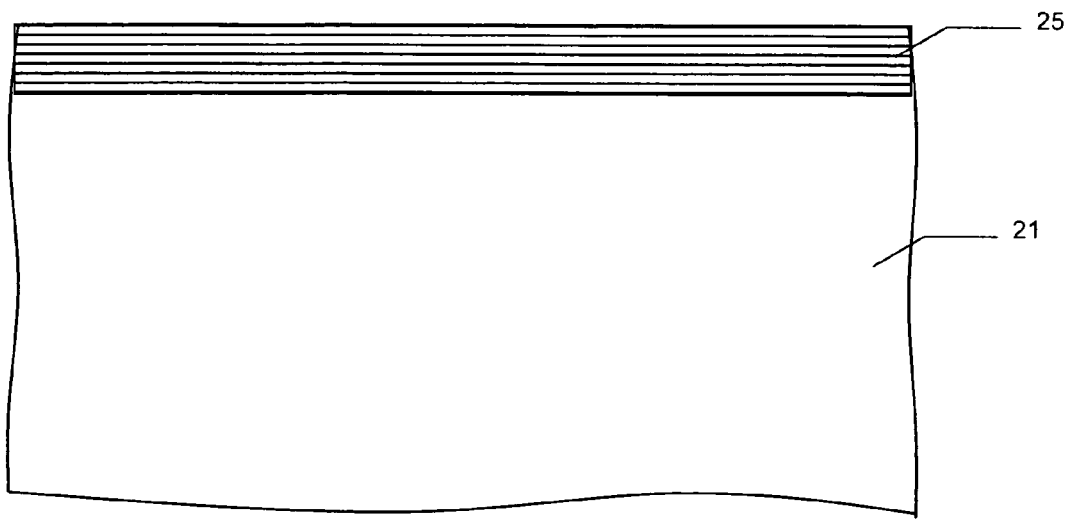
FIGS. 6A-6E are a series of schematic cross-sectional diagrams illustrating a method for making the semiconductor device of FIG. 1.

More particularly, the superlattice 25 material is deposited across the surface of the substrate 21 using atomic layer deposition and the epitaxial silicon cap layer 52 is formed, as discussed previously above, and the surface is planarized to arrive at the structure of FIG. 6A. It should be noted that in some embodiments the superlattice 25 material may be selectively deposited in those regions where channels are to be formed, rather than across the entire substrate 21, as will be appreciated by those skilled in the art. Moreover, planarization may not be required in all embodiments.

The epitaxial silicon cap layer 52 may have a preferred thickness to prevent superlattice consumption during gate oxide growth, or any other subsequent oxidations, while at the same time reducing or minimizing the thickness of the silicon cap layer to reduce any parallel path of conduction with the superlattice. According to the well-known relationship of consuming approximately 45% of the underlying silicon for a given oxide grown, the silicon cap layer may be greater than 45% of the grown gate oxide thickness plus a small incremental amount to account for manufacturing tolerances known to those skilled in the art. For the present example, and assuming growth of a 25 angstrom gate, one may use approximately 13-15 angstroms of silicon cap thickness.

Figure 6B:
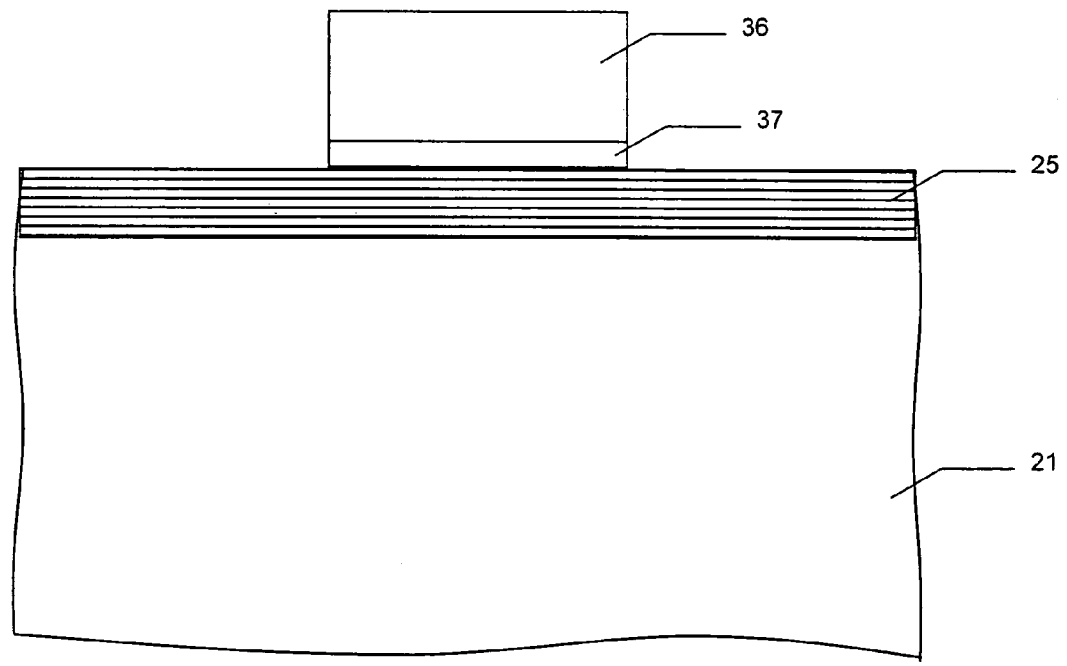

FIG. 6B depicts the MOSFET 20 after the gate oxide 37 and the gate electrode 36 are formed. More particularly, a thin gate oxide is deposited, and steps of poly deposition, patterning, and etching are performed, as will be appreciated by those skilled in the art. Poly deposition refers to low pressure chemical vapor deposition (LPCVD) of silicon onto an oxide (hence it forms a polycrystalline material). The step includes doping with P+ or As– to make it conducting, and the layer may be around 250 nm thick, for example.

In addition, the pattern step may include performing a spinning photoresist, baking, exposure to light (i.e., a photolithography step), and developing the resist. Usually, the pattern is then transferred to another layer (oxide or nitride) which acts as an etch mask during the etch step. The etch step typically is a plasma etch (anisotropic, dry etch) that is material selective (e.g., etches silicon ten times faster than oxide) and transfers the lithography pattern into the material of interest.

Figure 6C:
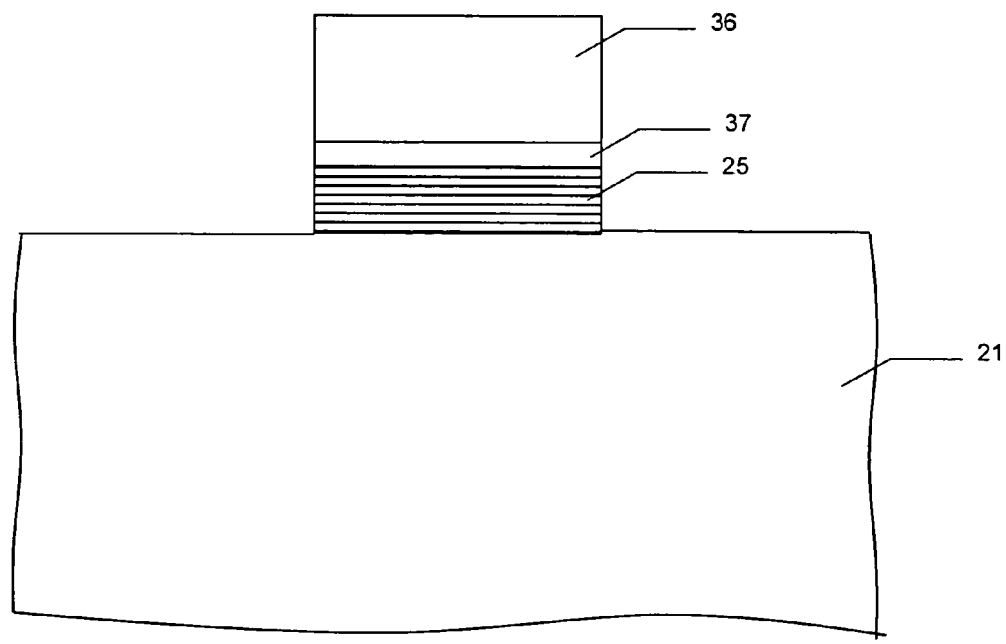

Referring to FIG. 6C, once the gate 35 is formed, the gate may then be used as an etch mask to remove the superlattice 25 material in the regions where the source and drain 22, 23 are to be formed, as will be appreciated by those skilled in the art. The superlattice 25 material may be etched in a similar fashion to that described above for the gate 35. However, it should be noted that with the non-semiconductor present in the superlattice 25, e.g., oxygen, the superlattice may be more easily etched using an etchant formulated for oxides rather than silicon. Of course, the appropriate etch for a given implementation will vary based upon the structure and materials used for the superlattice 25 and substrate 21, as will be appreciated by those of skill in the art.

Figure 6D:
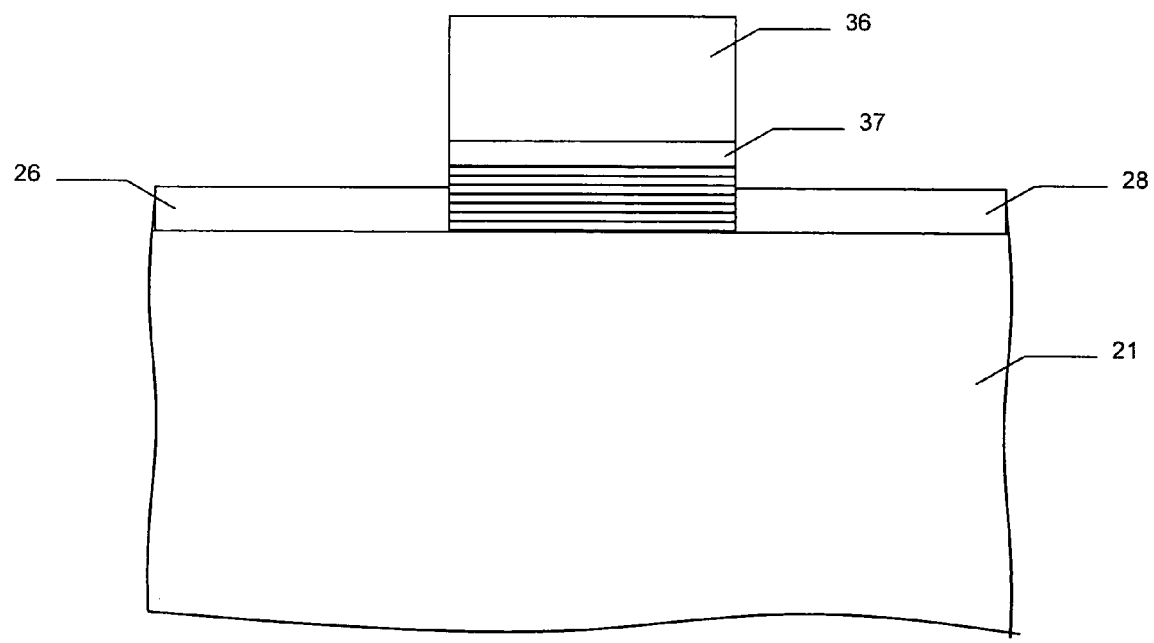
Figure 6E:
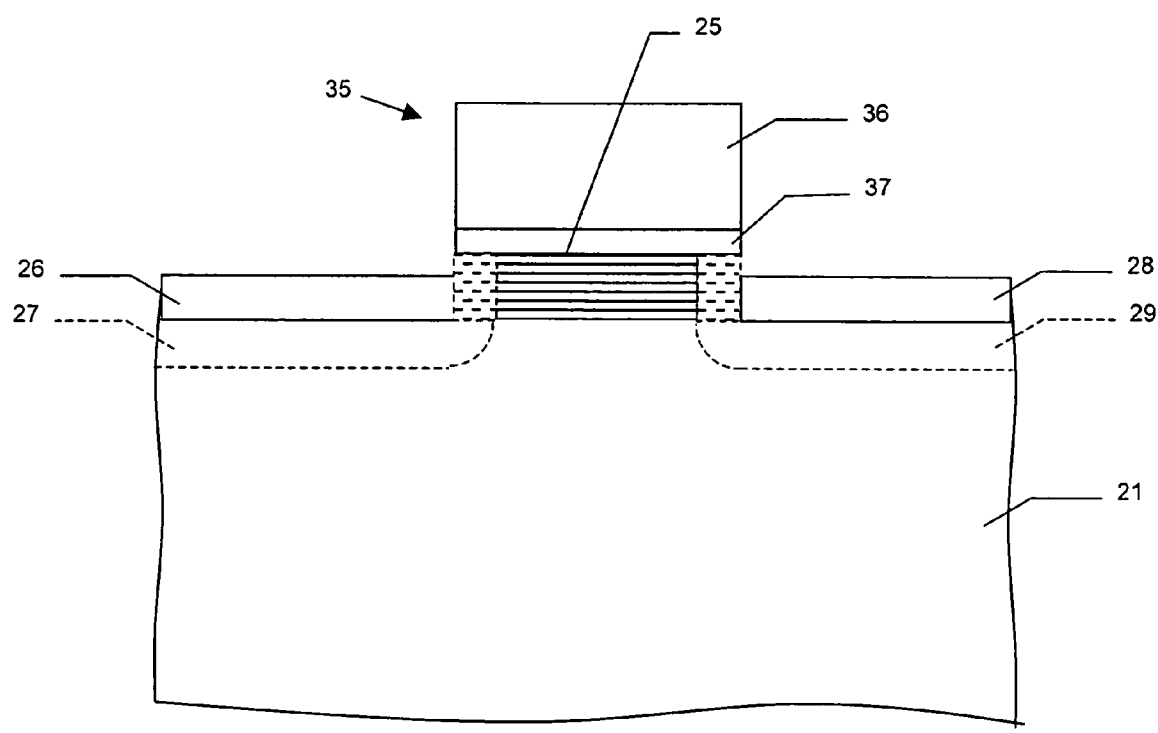

In FIG. 6D, the epitaxial source and drain layers 26, 28 are formed, which may be done using known epitaxial deposition methods. Referring to FIG. 6E, the source and drain regions 22, 23 are doped using the appropriate n-type or p-type implantation. An anneal and/or clean step may be used after the implantation, but depending on the specific process, they may be omitted. Self-aligned silicide formation may then be performed to form the silicide layers 30, 31, and 34, and the source/drain contacts 32, 33, are formed to provide the final semiconductor device 20 illustrated in FIG. 1. The silicide formation is also known as salicidation. The salicidation process includes metal deposition (e.g. Ti), nitrogen annealing, metal etching, and a second annealing.

The foregoing is, of course, but one example of a process and device in which the present invention may be used, and those of skill in the art will understand its application and use in many other processes and devices. In other processes and devices the structures of the present invention may be formed on a portion of a wafer or across substantially all of a wafer. Additionally, the use of an atomic layer deposition tool may also not be needed for forming the superlattice 25 in some embodiments. For example, the monolayers may be formed using a CVD tool with process conditions compatible with control of monolayers, as will be appreciated by those skilled in the art.

Figure 7A:
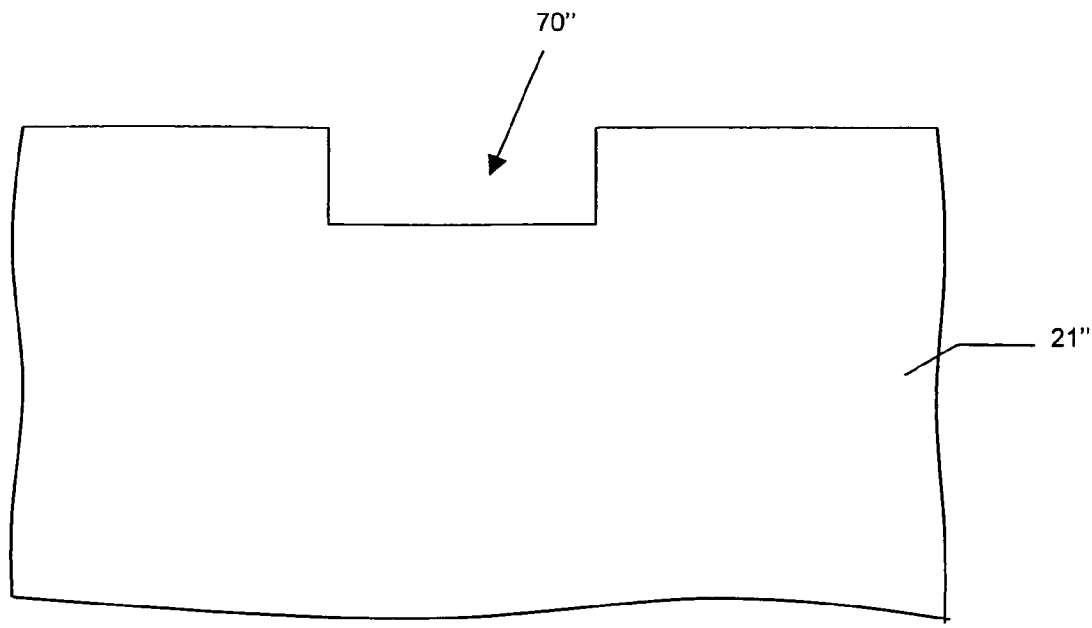
FIGS. 7A-7E are a series of schematic cross-sectional diagrams illustrating a method for making an alternate embodiment of the semiconductor device of FIG. 1.
Figure 7B:
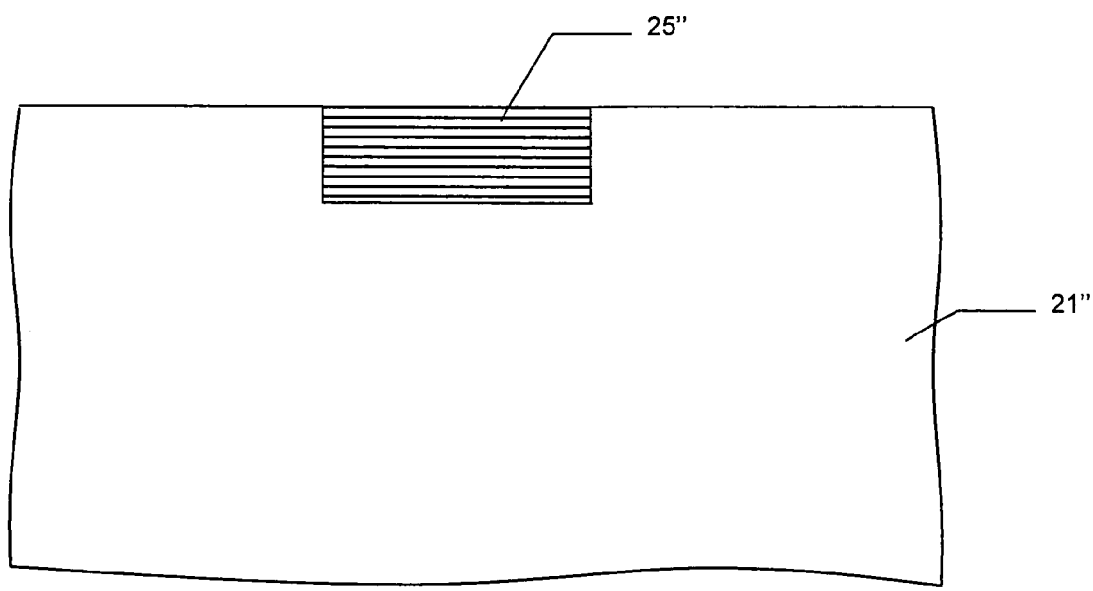
Figure 7C:
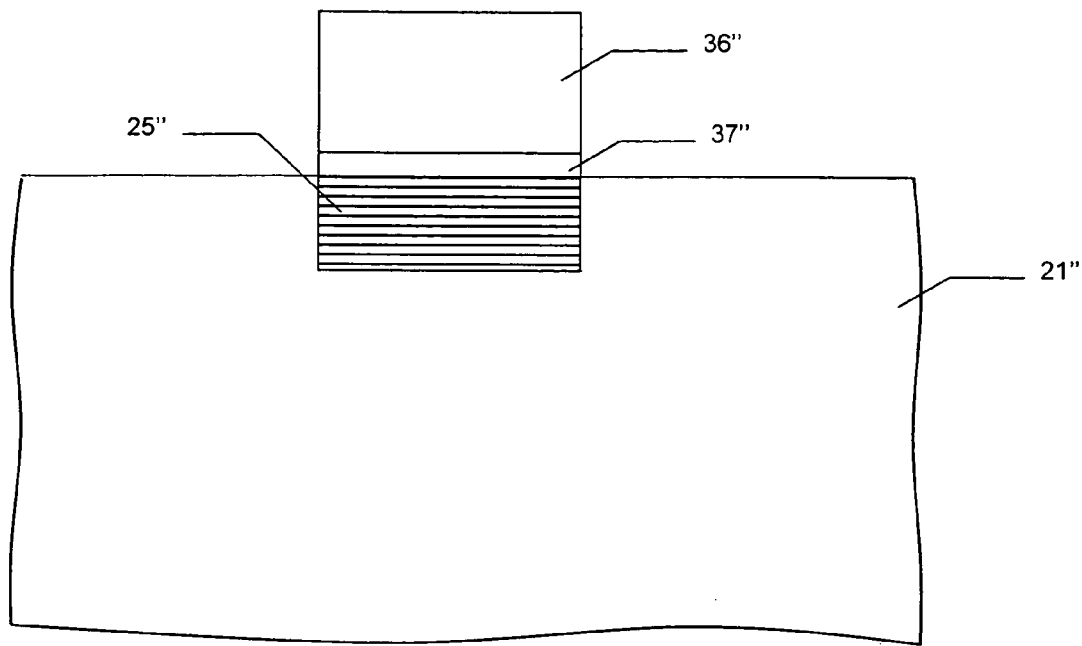
Figure 7D:
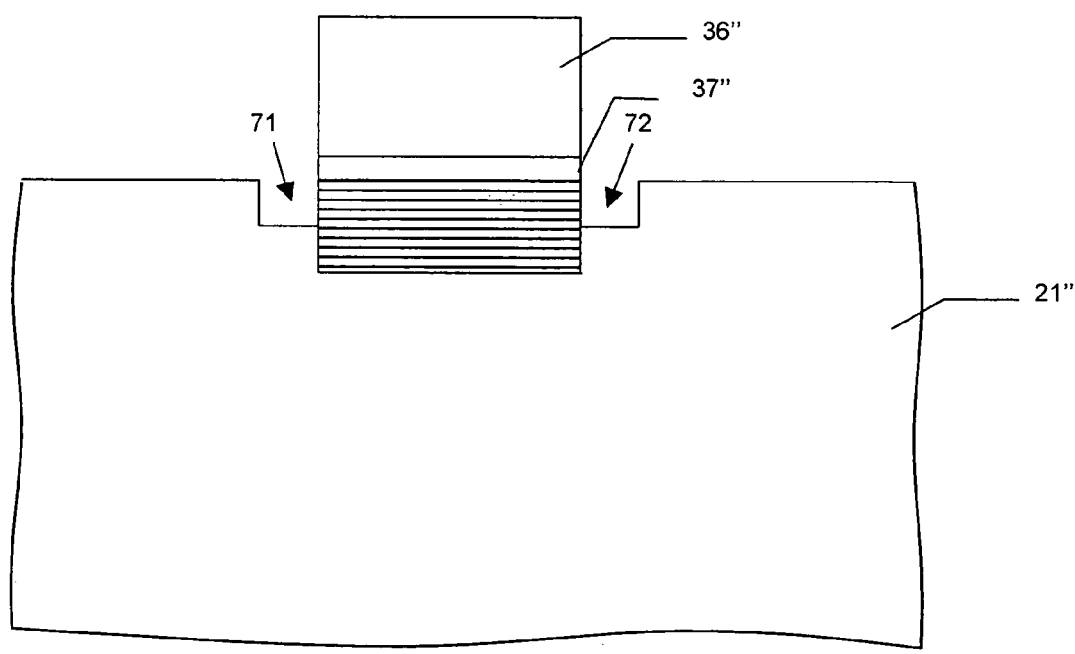

An alternate embodiment of the semiconductor device 20" and method form making the same will now be described with reference to FIGS. 7A-7E and 8. First, a trench 70" is formed in the substrate 21" using known semiconductor techniques (FIG. 7A). Next, the superlattice 25" is formed within the trench 70" (FIG. 7B), as described above. The gate insulating layer 37" and gate electrode layer 36" are then formed and patterned, as necessary, as seen in FIG. 7C. Trenches 71", 72" are then formed next to the gate in the substrate 21" in the areas where the source and drain regions 23", 24" are to be formed (FIG. 7D).

Figure 7E:
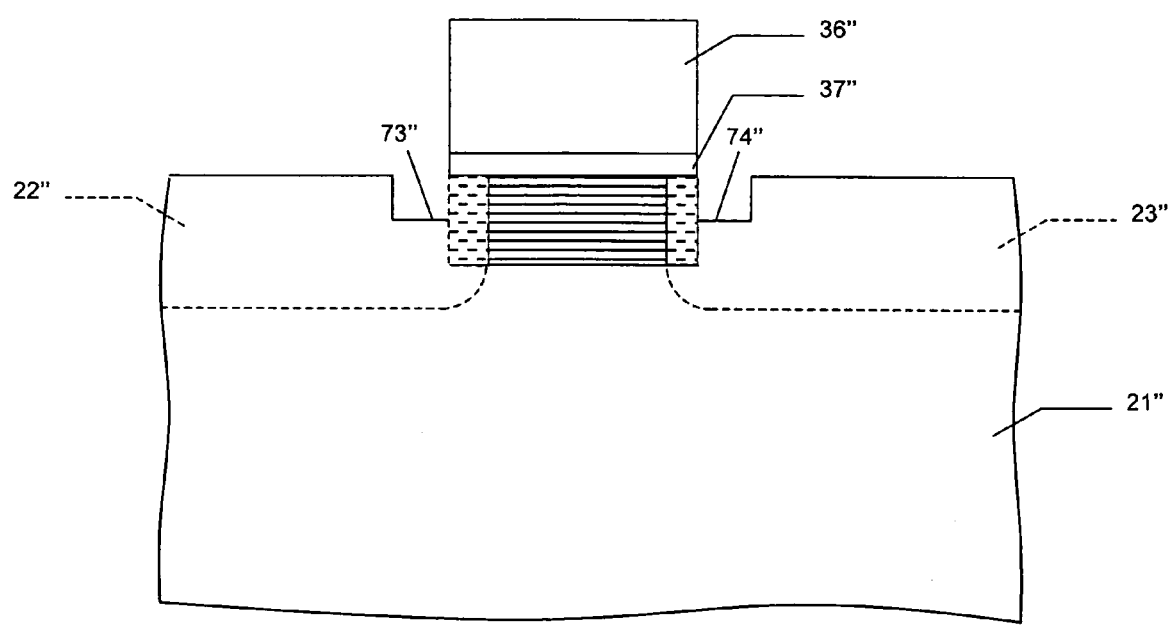
Figure 8:
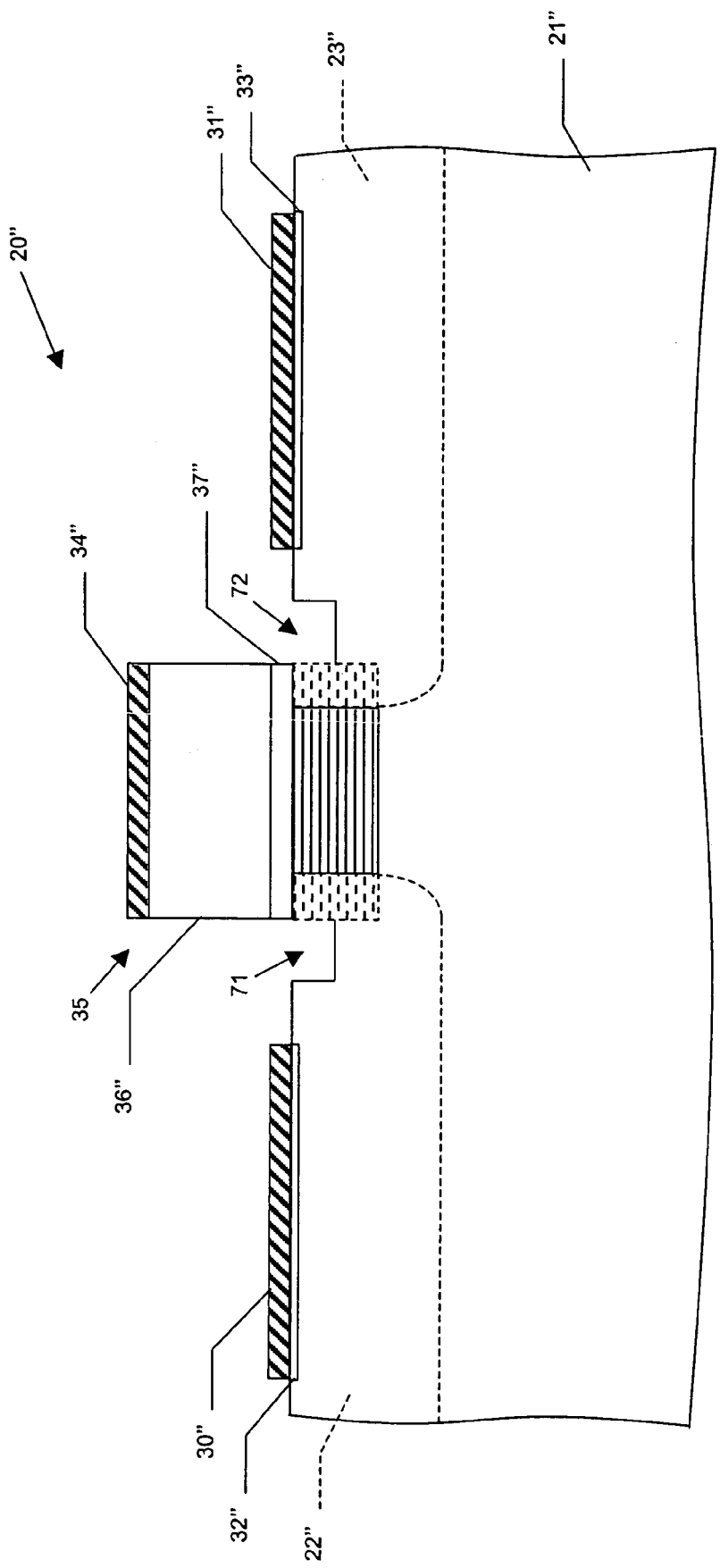
FIG. 8 is a schematic cross-sectional diagram illustrating a completed semiconductor device formed using the method steps illustrated in FIGS. 7A-7E.

Thus, it may be seen that the upper portions of the superlattice 25" extend above bottom portions 73", 74" of the trenches 71", 72". Again, this creates a channel region which occupies only the lower portions of the superlattice 25", thus advantageously reducing current flow near the gate insulation layer 37". Source and drain implantation is next performed, as described above, to form the source and drain regions 22", 23" (FIG. 7E). Furthermore, silicide formation may then be performed to form the silicide layers 30", 31", and 34", and the source/drain contacts 32", 33" are formed to provide the final semiconductor device 20" illustrated in FIG. 8.

It should be noted that certain of the above-noted steps may be performed in different orders in different embodiments. For example, the trenches 71", 72" may be formed after implantation of the source and drain regions 22", 23". Moreover, in an alternate embodiment, the trenches 71", 72" may be formed in the superlattice 25" at the outer edges thereof to provide the desired separation between the upper portions of the superlattice and the source and drain regions 22", 23", as will be appreciated by those skilled in the art.

While only a single MOSFET 20" has been illustrated in the drawings and described above for clarity of explanation and illustration, it will be appreciated that multiple MOSFETs may be formed in the substrate 21", such as NMOS and PMOS transistors to provide a CMOS device. More particularly, shallow trench isolation (STI) regions (not shown) may be formed between adjacent MOSFETS, as will be appreciated by those skilled in the art. In accordance with one embodiment, the STI regions may be formed prior to depositing the superlattice 25", so that the STI regions thus provide boundaries for selective deposition of the superlattice.

More particularly, the wafer is patterned and trenches are etched (e.g., 0.3-0.8 um) in the desired STI regions. A thin oxide is then grown, and the trenches are filled with $SiO_2$ to provide the STI regions, and the upper surfaces thereof may be planarized, if desired. The STI regions may also be used as an etch stop in performing certain of the above-noted steps, as will be appreciated by those skilled in the art. The superlattice 25" structure may also be formed prior to formation of the STI regions to thereby eliminate a masking step, if desired. Further details regarding fabrication of the semiconductor devices in accordance with the present invention may be found in the above-noted U.S. application Ser. No. 10/467,069.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
a semiconductor substrate; and
at least one metal oxide semiconductor field-effect transistor (MOSFET) comprising
spaced apart source and drain regions on said semiconductor substrate,
a superlattice comprising a plurality of stacked groups of layers on said semiconductor substrate between said source and drain regions, said superlattice having upper portions extending above adjacent upper portions of said source and drain regions and lower portions contacting said source and drain regions so that a channel is defined in lower portions of said superlattice,
each group of layers of said superlattice comprising a plurality of stacked base semiconductor monolayers defining a base semiconductor portion and at least one non-semiconductor monolayer thereon,
said at least one non-semiconductor monolayer being constrained within a crystal lattice of adjacent base semiconductor portions, and at least some semiconductor atoms from opposing base semiconductor portions being chemically bound together through the at least one non-semiconductor monolayer therebetween, and
a gate overlying said superlattice.

2. The semiconductor device of claim 1 wherein each of said source and drain regions comprises a respective epitaxial silicon layer.

3. The semiconductor device of claim 2 wherein said superlattice has a greater thickness than said epitaxial silicon layers.

4. The semiconductor device of claim 1 wherein said source and drain regions each have a respective trench therein adjacent said superlattice; and wherein the upper portions of said superlattice extend above bottom portions of the trenches.

5. The semiconductor device of claim 1 wherein said gate comprises an oxide layer overlying said superlattice channel and a gate electrode overlying said oxide layer.

6. The semiconductor device of claim 1 further comprising a contact layer on at least one of said source and drain regions.

7. The semiconductor device of claim 1 wherein said superlattice has a common energy band structure therein.

8. The semiconductor device of claim 1 wherein said superlattice has a higher charge carrier mobility than would otherwise be present without said non-semiconductor layer.

9. The semiconductor device of claim 1 wherein each base semiconductor portion comprises silicon.

10. The semiconductor device of claim 1 wherein each base semiconductor portion comprises germanium.

11. The semiconductor device of claim 1 wherein each non-semiconductor monolayer compises oxygen.

12. The semiconductor device of claim 1 wherein each non-semiconductor monolayer is a single monolayer thick.

13. The semiconductor device of claim 1 wherein each base semiconductor portion is less than eight monolayers thick.

14. The semiconductor device of claim 1 wherein said superlattice further has a substantially direct energy bandgap.

15. The semiconductor device of claim 1 wherein said superlattice further comprises a base semiconductor cap layer on an uppermost group of layers.

16. The semiconductor device of claim 1 wherein all of said base semiconductor portions are a same number of monolayers thick.

17. The semiconductor device of claim 1 wherein at least some of said base semiconductor portions are a different number of monolayers thick.

18. The semiconductor device of claim 1 wherein each non-semiconductor monolayer comprises a non-semiconductor selected from the group consisting of oxygen, nitrogen, fluorine, and carbon-oxygen.

19. A semiconductor device comprising:
a semiconductor substrate; and
at least one metal oxide semiconductor field-effect transistor (MOSFET) comprising
spaced apart source and drain regions on said semiconductor substrate,
a superlattice comprising a plurality of stacked groups of layers on said semiconductor substrate between said source and drain regions,
said source and drain regions each having a respective trench therein adjacent said superlattice, and said superiattice having upper portions extending above bottom portions of the trenches, and lower portions contacting said source and drain regions so that a channel is defined in lower portions of said superlattice,
each group of layers of said superlattice comprising a plurality of stacked base semiconductor monolayers defining a base semiconductor portion and an energy band-modifying layer thereon,
said energy-band modifying layer comprising at least one non-semiconductor monolayer constrained within a crystal lattice of adjacent base semiconductor portions, and at least some semiconductor atoms from opposing semiconductor portions being chemically bound together through the at least one non-semiconductor monolayer therebetween, and a gate overlying said superlattice comprising an oxide layer overlying said superlattice channel and a gate electrode overlying said oxide layer.

20. The semiconductor device of claim 19 further comprising a contact layer on at least one of said source and drain regions.

21. The semiconductor device of claim 19 wherein said superlattice has a common energy band structure therein.

22. The semiconductor device of claim 19 wherein said superlattice has a higher charge carrier mobility than would otherwise be present without said non-semiconductor layer.

23. The semiconductor device of claim 19 wherein each base semiconductor portion comprises silicon.

24. The semiconductor device of claim 19 wherein each base semiconductor portion comprises germanium.

25. The semiconductor device of claim 19 wherein each energy band-modifying layer comprises oxygen.

26. The semiconductor device of claim 19 wherein each energy band-modifying layer is a single monolayer thick.

27. The semiconductor device of claim 19 wherein each base semiconductor portion is less than eight monolayers thick.

28. The semiconductor device of claim 19 wherein said superlattice further has a substantially direct energy bandgap.

29. The semiconductor device of claim 19 wherein said superlattice further comprises a base semiconductor cap layer on an uppermost group of layers.

30. The semiconductor device of claim 19 wherein all of said base semiconductor portions are a same number of monolayers thick.

31. The semiconductor device of claim 19 wherein at least some of said base semiconductor portions are a different number of monolayers thick.

32. The semiconductor device of claim 19 wherein each energy band-modifying layer comprises a non-semiconductor selected from the group consisting of oxygen, nitrogen, fluorine, and carbon-oxygen.

33. A semiconductor device comprising:
a semiconductor substrate; and
at least one metal oxide semiconductor field-effect transistor (MOSFET) comprising
spaced apart source and drain regions on said semiconductor substrate each comprising a respective epitaxial silicon layer,
a superlattice comprising a plurality of stacked groups of layers on said semiconductor substrate between said epitaxial silicon layers, said superlattice having a greater thickness than said epitaxial silicon layers, and lower portions of said superlattice contacting said epitaxial silicon layers so that a channel is defined in lower portions of said superlattice,
each group of layers of said superlattice comprising a plurality of stacked base semiconductor monolayers defining a base semiconductor portion and an energy bandmodifying layer thereon,
said energy-band modifying layer comprising at least one nonsemiconductor monolayer constrained within a crystal lattice of adjacent base semiconductor portions, and at least some semiconductor atoms from opposing semiconductor portions being chemically bound together through the at least one non-semiconductor monolayer therebetween, and
a gate overlying said superlattice comprising an oxide layer overlying said superlattice channel and a gate electrode overlying said oxide layer.

34. The semiconductor device of claim 33 further comprising a contact layer on at least one of said source and drain regions.

35. The semiconductor device of claim 33 wherein said superlattice has a common energy band structure therein.

36. The semiconductor device of claim 33 wherein said superlattice has a higher charge carrier mobility than would otherwise be present without said non-semiconductor layer.

37. The semiconductor device of claim 33 wherein each base semiconductor portion comprises silicon.

38. The semiconductor device of claim 33 wherein each base semiconductor portion comprises germanium.

39. The semiconductor device of claim 33 wherein each energy band-modifying layer comprises oxygen.

40. The semiconductor device of claim 33 wherein each energy band-modifying layer is a single monolayer thick.

41. The semiconductor device of claim 33 wherein each base semiconductor portion is less than eight monolayers thick.

42. The semiconductor device of claim 33 wherein said superlattice further has a substantially direct energy bandgap.

43. The semiconductor device of claim 33 wherein said superlattice further comprises a base semiconductor cap layer on an uppermost group of layers.

44. The semiconductor device of claim 33 wherein all of said base semiconductor portions are a same number of monolayers thick.

45. The semiconductor device of claim 33 wherein at least some of said base semiconductor portions are a different number of monolayers thick.

46. The semiconductor device of claim 33 wherein each energy band-modifying layer comprises a non-semiconductor selected from the group consisting of oxygen, nitrogen, fluorine, and carbon-oxygen.

* * * * *

UNITED STATES PATENT AND TRADEMARK OFFICE
CERTIFICATE OF CORRECTION

PATENT NO. : 7,279,701 B2  Page 1 of 1
APPLICATION NO. : 10/941062
DATED : October 9, 2007
INVENTOR(S) : Mears et al.

It is certified that error appears in the above-identified patent and that said Letters Patent is hereby corrected as shown below:

| | |
|---|---|
| Column 6, Line 55 | Delete: "45$n$ The"<br>Insert: -- 45$n$. The -- |
| Column 6, Line 67 | Delete: "example"<br>Insert: -- example. -- |
| Column 8, Line 34 | Delete: "In"<br>Insert: -- in -- |
| Column 12, Line 18 | Delete: "compises"<br>Insert: -- comprises -- |
| Column 12, Line 52 | Delete: "superiattice"<br>Insert: -- superlattice -- |
| Column 13, Line 10 | Delete: "superiattice"<br>Insert: -- superlattice -- |
| Column 14, Line 4 | Delete: "bandmodifying"<br>Insert: -- band-modifying -- |
| Column 14, Line 6 | Delete: "nonsemiconductor"<br>Insert: -- non-semiconductor -- |

Signed and Sealed this

Seventeenth Day of June, 2008

JON W. DUDAS
*Director of the United States Patent and Trademark Office*